United States Patent [19]
Pfiester et al.

[11] Patent Number: 5,334,861
[45] Date of Patent: Aug. 2, 1994

[54] SEMICONDUCTOR MEMORY CELL

[75] Inventors: James R. Pfiester; James D. Hayden, both of Austin, Tex.

[73] Assignee: Motorola Inc., Schaumburg, Ill.

[21] Appl. No.: 885,333

[22] Filed: May 19, 1992

[51] Int. Cl.$^5$ .............................................. H01L 27/01
[52] U.S. Cl. ..................................... 257/67; 257/369; 257/69
[58] Field of Search ................... 257/903, 369, 67, 69, 257/296

[56] References Cited

U.S. PATENT DOCUMENTS

| | | | |
|---|---|---|---|
| 4,543,592 | 10/1985 | Itsumi et al. | 257/369 |
| 4,581,623 | 4/1986 | Wang | 257/67 |
| 4,918,510 | 4/1990 | Pfiester | 257/69 |
| 5,001,539 | 3/1991 | Inoue et al. | 257/903 |
| 5,072,275 | 2/1991 | Vora | 257/903 |
| 5,132,771 | 7/1992 | Yamanaka | 357/59 |
| 5,241,193 | 8/1993 | Pfiester et al. | 252/67 |

OTHER PUBLICATIONS

K. Itabashi, et al., "A Split Wordline Cell for 16Mb SRAM Using Polysilicon Sidewall Contacts", IEEE Int. Electron Device Meet., Washington, D.C., Dec. 1992, pp. 477–480.

H. Ohkubo, et al., "16Mbit SRAM Cell Technologies for 2.0V Operations", IEEE Int. Electron Device Meet., Washington D.C., Dec. 1991, pp. 480–484.

*Primary Examiner*—Rolf Hille
*Assistant Examiner*—Alexander Oscar Williams
*Attorney, Agent, or Firm*—Jasper W. Dockrey

[57] ABSTRACT

A semiconductor memory cell (10) including cross coupled CMOS transistors (12, 14) wherein an N-channel transistor (20) overlies a central portion of each of a first and second active regions (13, 13') at a position intermediate to two word lines (40, 42) which overlie end portions of the active regions (13, 13'). P-channel pull-up transistors (18, 22) overlie the N-channel transistors (16, 20) and share common intermediate gate electrodes (27, 29). Staggered bit line contacts (48, 50) are formed to each active region (13, 13') adjacent to each word line (40, 42) and opposite to the N-type transistors (16, 20). Staggered Vss contacts (52, 54) are provided to each active region (13, 13') adjacent to the word lines (40, 42) and opposite to the bit line contacts (48, 50). A Vss signal is electrically coupled to the N-channel transistors (16, 20) by a doped region (21) formed in the first and second active regions (13, 13') which cross under the word lines (40, 42). A Vss contact land (71) is provided by a conductive body overlying the active region in the staggered Vss contacts (52, 54) and a portion of the adjacent word lines (40, 42) and at least a portion of the CMOS transistors (12, 14) opposite the word lines (40, 42).

17 Claims, 6 Drawing Sheets

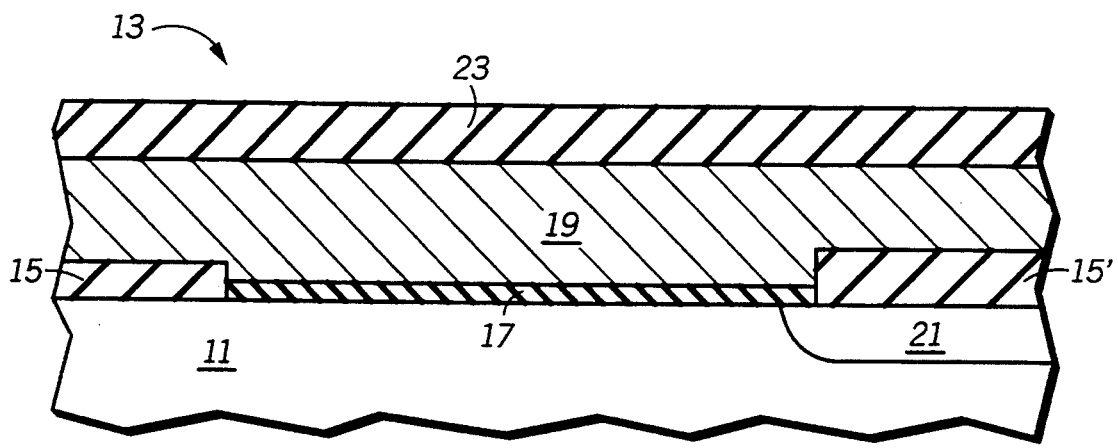
*FIG.3-a*
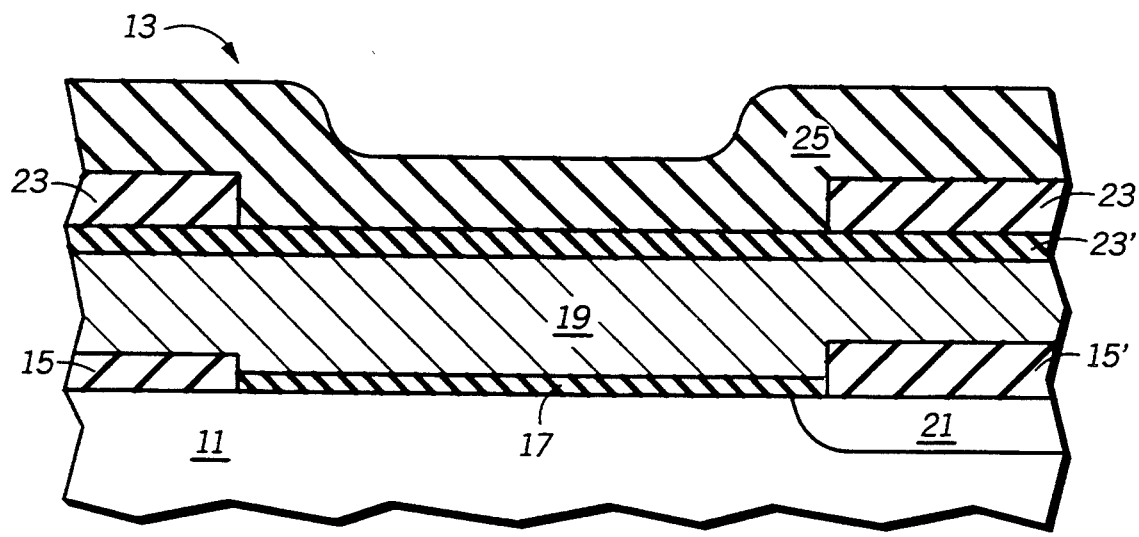
*FIG.3-b*
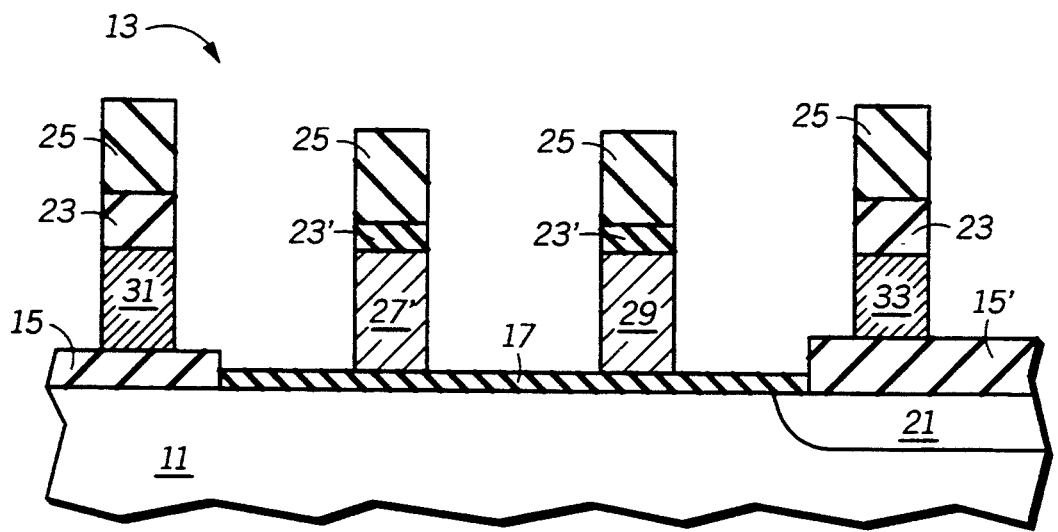
*FIG.3-c*

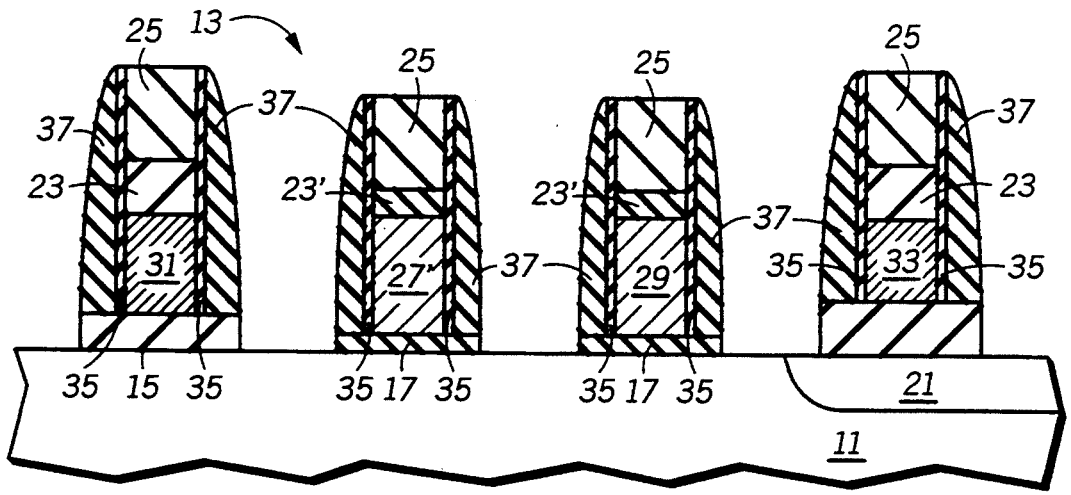
*FIG.3-d*
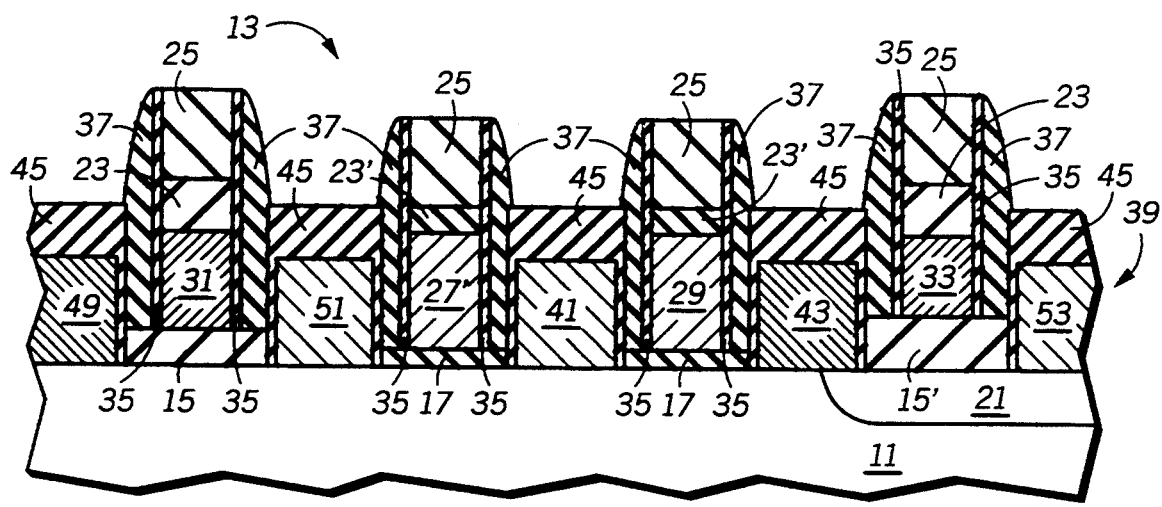
*FIG.3-e*
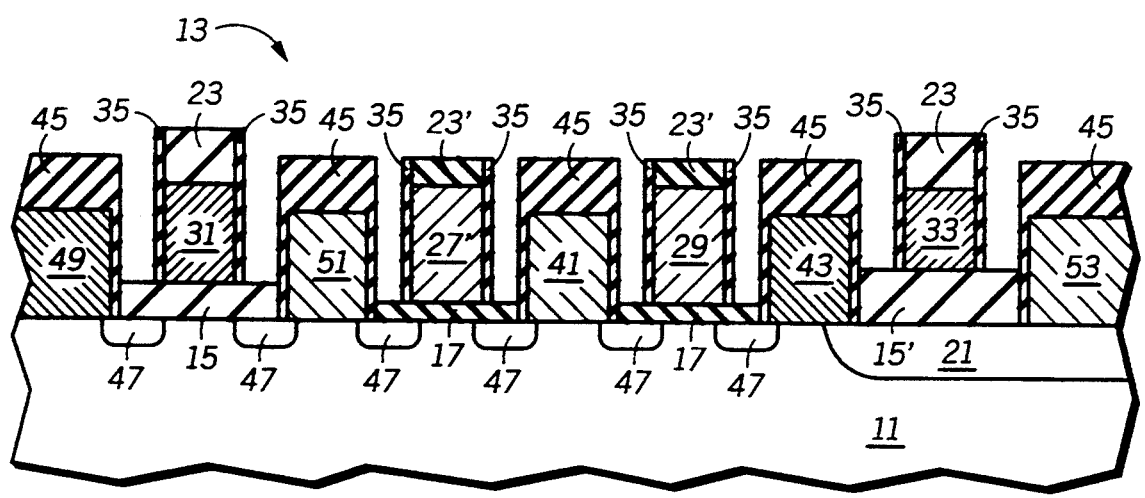
*FIG.3-f*

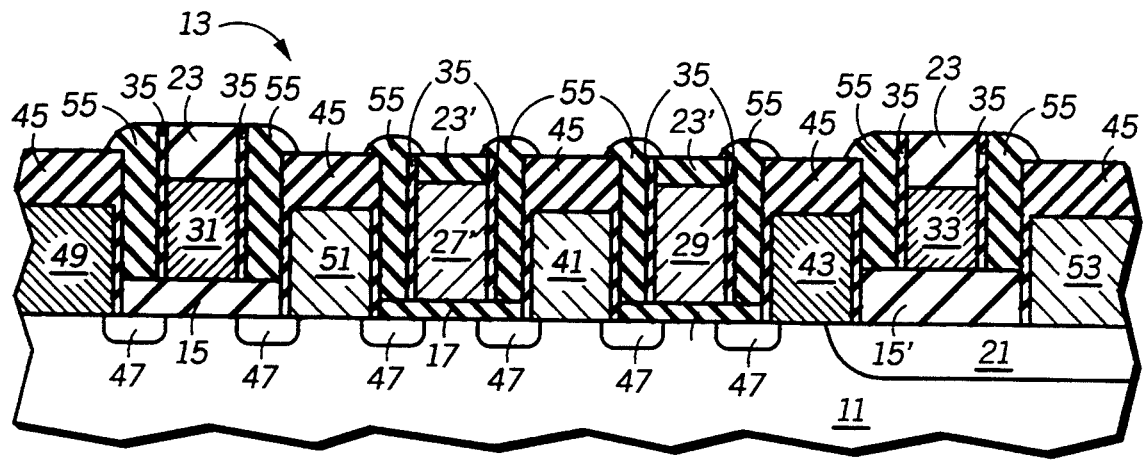
*FIG.3-g*
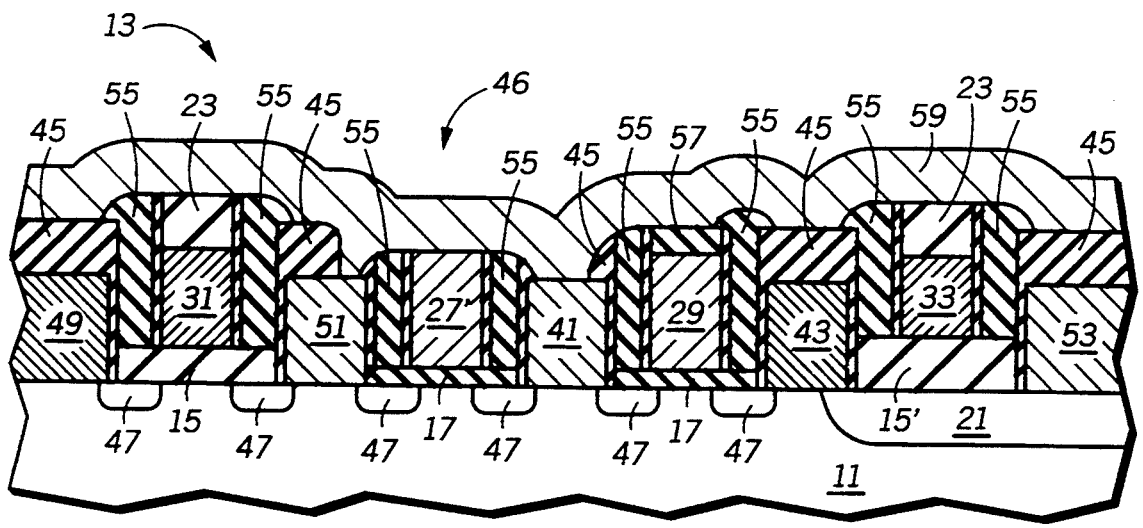
*FIG.3-h*
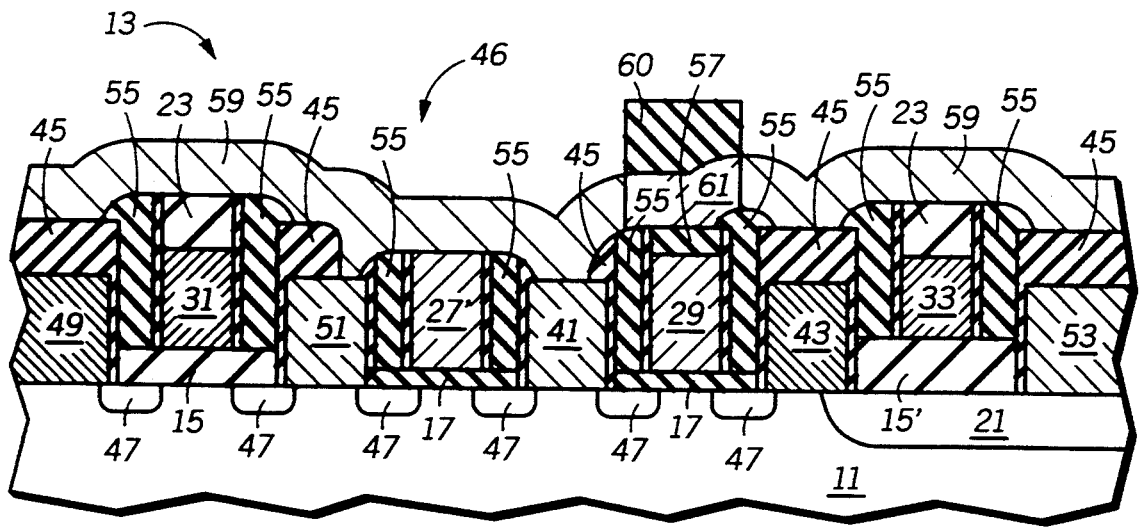
*FIG.3-i*

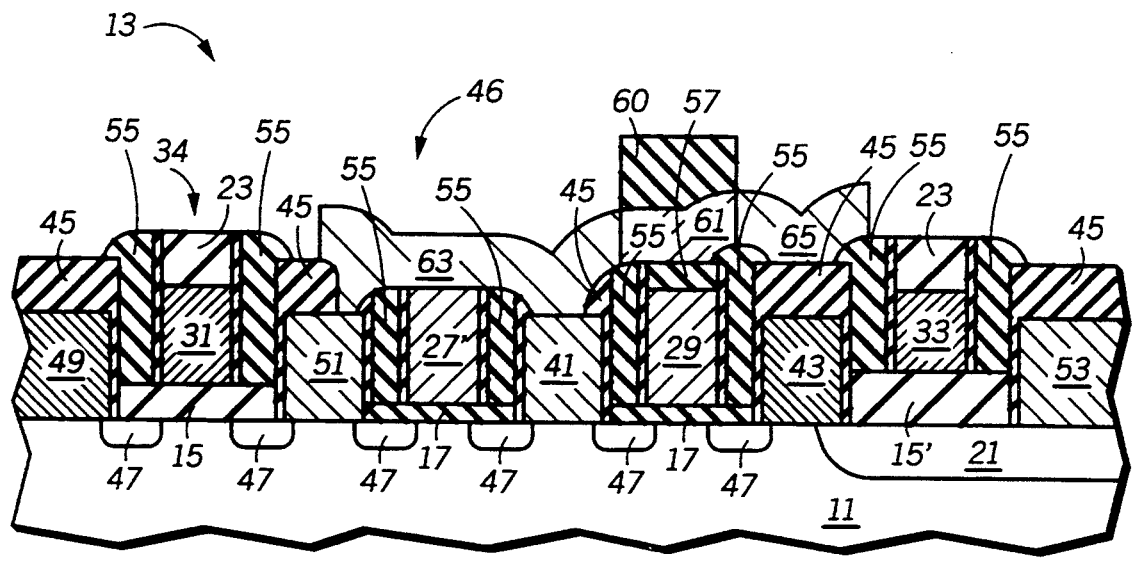
FIG.3-j
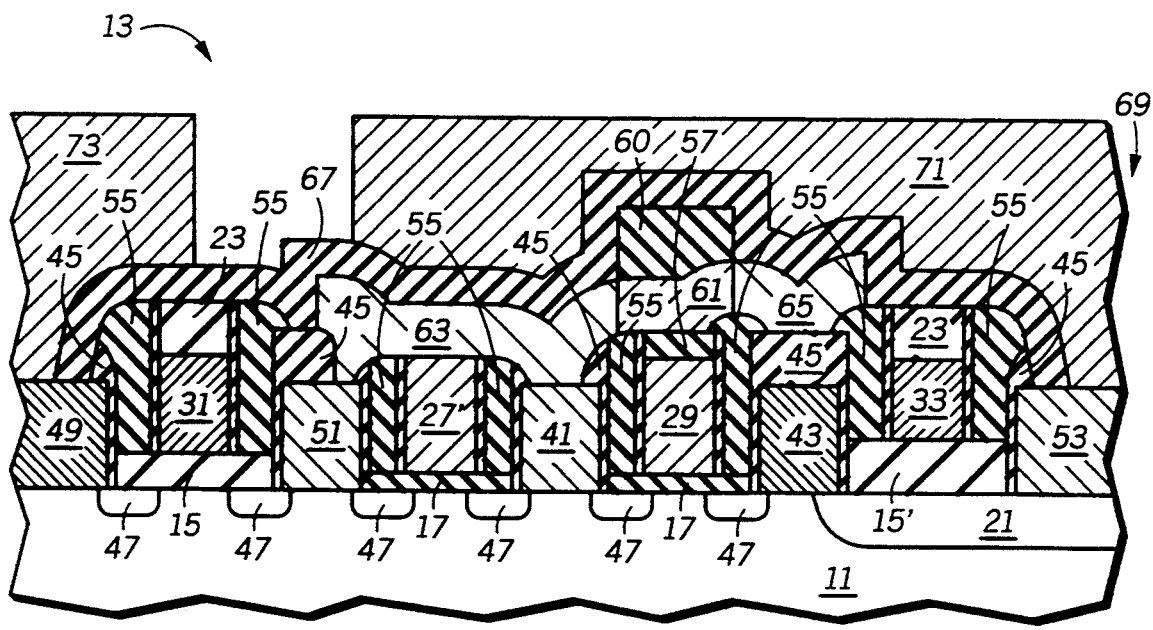
FIG.3-k

SEMICONDUCTOR MEMORY CELL

FIELD OF THE INVENTION

This invention relates in general to semiconductor devices, and more particularly to semiconductor memory devices.

RELATED APPLICATION

Related subject matter is disclosed in commonly assigned, patent application having U.S. Ser. No. 07/885,332 now U.S. Pat. No. 5,241,193, issued Aug. 31, 1993.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM) or static-random-access-memory device (SRAM), the components must be arranged compactly if the overall device dimensions are not to become excessively large. This problem is especially critical in SRAM devices where a typical individual memory cell contains as many as six separate components.

In particular, SRAM memory cells suffer stability problems as cell size is reduced. To function properly, the SRAM memory cell, when charged, must hold a voltage level, either high (logic 1) or low (logic 0). When reading data from the cell, the charge pulse generated as the pass transistor turns on must not flip the voltage level at the output nodes. Usually this problem is controlled by adjusting the width-to-length (W/L) ratios of the driver transistor relative to the access transistor. The ratio of the W/L values of the two transistors is known as the cell ratio and is commonly specified to be at least 3.0 or larger.

One technique to reduce SRAM memory cell dimensions and to maintain cell stability is to split the word line over the cell. The word line controls read and write functions to the cell by turning the access transistors on and off. By splitting the word line into two separate lines, a more symmetrical cell layout is possible while at the same time maintaining a high cell ratio.

However, even with the foregoing improvements in memory cell design, a need remains to further reduce the overall cell dimensions. Although split word line designs reduce the area of the cell, fundamental manufacturing limitations remain. Active surface regions of the cell must be made available for the interconnection of leads providing supply and ground voltages to the cell. In addition, active surface area must be available for the formation of transistors providing read and write functions for the cell. Simple downsizing of components can only be pursued to the limit of the line-width definition capability of the manufacturing process. Once the line-width definition limits are reached, new design methodology must be employed if further reduction in memory cell area is to be achieved.

BRIEF SUMMARY OF THE INVENTION

In practicing the present invention there is provided a memory cell for a semiconductor device which includes a semiconductor body having an active region. A CMOS device having a first transistor of one conductivity type overlies a central portion of the active region and a second transistor of the opposite conductivity type overlies the first transistor. The first and second transistors have a common, shared-gate electrode. A word line overlies a peripheral portion of the active region and a Vss signal line is formed in the active region and passes under a portion of the word line. The Vss signal is electrically coupled to the first transistor providing Vss signal access from opposite the word line.

BRIEF DESCRIPTION OF THE DRAWINGS

FIGS. 3a through 3k, illustrate, in cross section, sectional, sequential fabrication steps in accordance with the invention taken along line 3—3 of FIG. 2;

Figure 1:
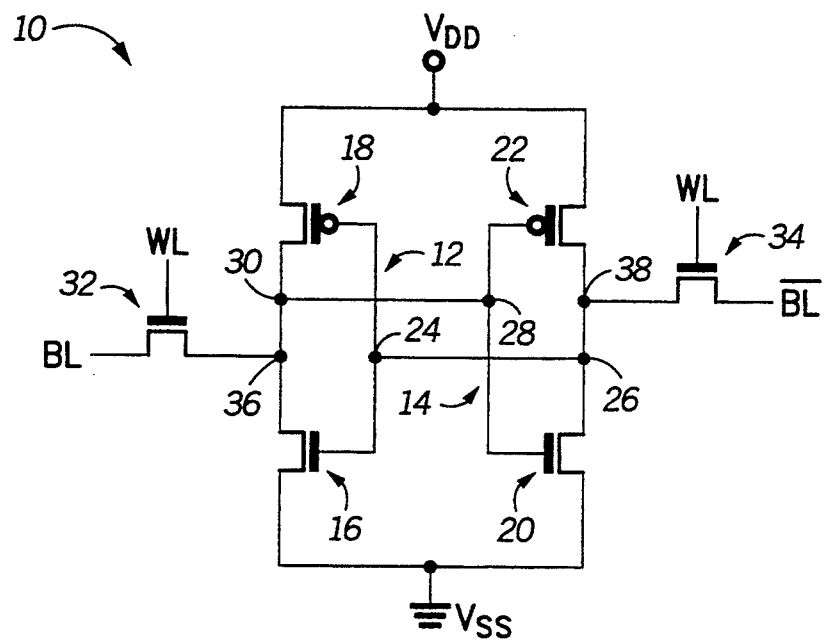
FIG. 1 is a schematic circuit diagram of an SRAM memory cell.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE INVENTION

Shown in FIG. 1 is schematic circuit diagram of an SRAM memory cell 10. Memory cell 10 is illustrated in an MOS integrated circuit layout in accordance with the invention in FIG. 2, where like elements have the same reference numbers. Memory cell 10 includes two cross-coupled, CMOS inverters 12 and 14. CMOS inverter 12 includes an NMOS transistor 16 and a PMOS thin-film, pull-up transistor 18. Similarly, CMOS inverter 14 includes an NMOS transistor 20 and a PMOS thin-film, pull-up transistor 22. The input of CMOS inverter 12 is coupled to the output of inverter 14 by nodes 24 and 26 and the input of CMOS inverter 14 is coupled to the output of invertor 12 by nodes 28 and 30. Pass transistors 32 and 34 are coupled to the outputs of inverters 12 and 14 at nodes 36 and 38 respectively. Pass transistors 32 and 34 provide bit line access to memory cell 10. As further illustrated in FIG. 1, a Vdd signal is provided to the source regions of transistors 18 and 22 and a Vss signal is provided to the source regions of transistors 16 and 20.

Figure 2:
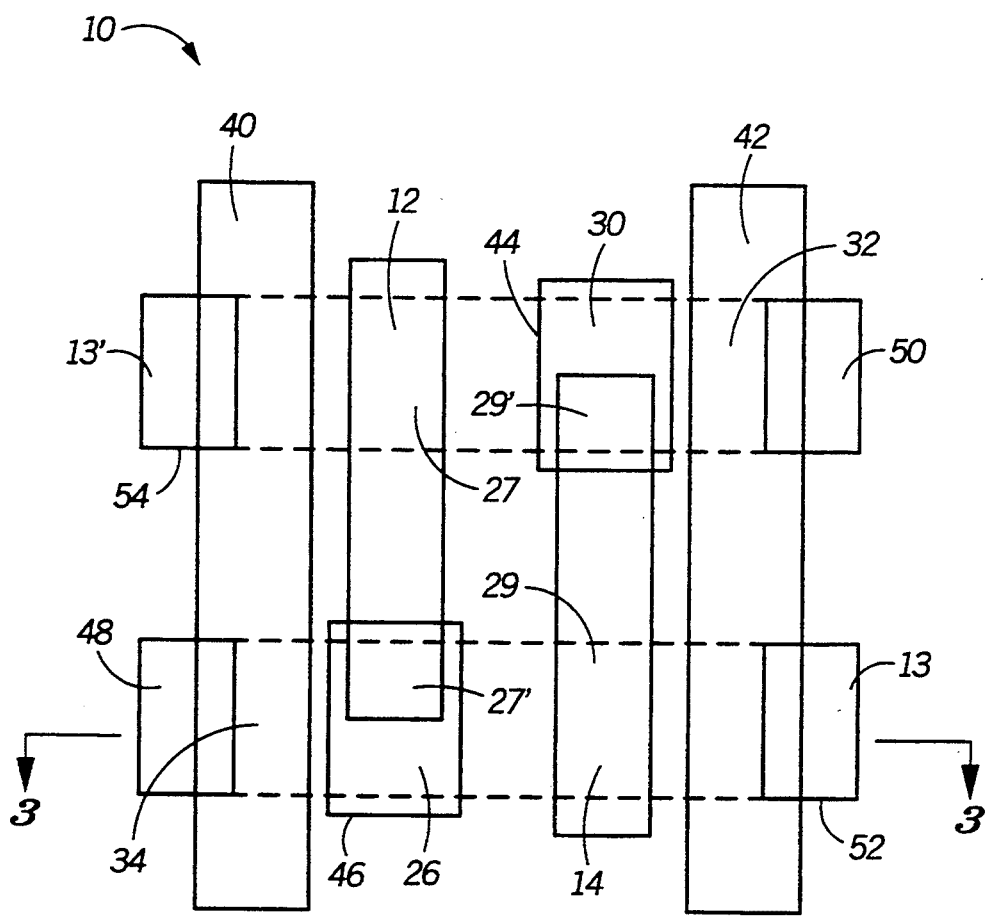
FIG. 2 is a plan view of a memory cell constructed in accordance with one embodiment of the invention.

A plan top view of memory cell 10 is shown in FIG. 2 where the locations of inverter 12 and 14, and transistors 32 and 34 are illustrated. Word lines 40 and 42 overlie active regions 13 and 13'. A portion of word line 40 passing over active region 13 forms the gate of pass transistor 34. Similarly, a portion of word line 42 overlying active region 13' forms the gate of pass transistor 32. As will subsequently be described, each of CMOS inverters 12 and 14 have a shared gate electrode. In the case of CMOS inverter 12, NMOS transistor 16 and PMOS transistor 18 have a shared gate electrode 27 overlying active region 13'. A portion of shared gate electrode 27, gate extension 27', extends to active region 13 and overlies a portion of active region 13. Correspondingly, CMOS inverter 14 has a shared gate electrode 29 overlying active region 13. A portion of shared gate electrode 29, gate extension 29', extends to active region 13' and overlies a portion of active region 13'. The channel and source and drain regions of PMOS thin-film transistors 18 and 22 are formed in an overlying conductive layers, which for purpose of clarity are not shown in FIG. 2.

Referring to FIGS. 1 and 2, node 30 is formed by shared contact 44 which connects the drain region of transistor 18 to the drain region of transistor 16. In addition, gate extension 29' of shared gate electrode 29 is connected to the drain of transistor 18 and at shared contact 44 forming node 30. Correspondingly, node 26 is formed by shared contact 46 which provides a connection point for drain regions of transistors 20 and 22. Also gate extension 27' of gate electrode 27 makes contact with the drain region of transistor 20 at shared contact 46. One bit line is coupled to active region 13 at bit line contact 48 and the complementary bit line is coupled to active region 13' at contact 50. Vss signal access is provided to active regions 13 and 13' by Vss contacts 52 and 54 respectively.

The relationship of the various components of memory cell 10 can be better understood following a description of the sequential process steps used in the fabrication of cell 10. Accordingly, the fabrication of memory cell 10 is illustrated in the sequential process steps shown in FIGS. 3a through 3k. FIGS. 3a through 3k illustrate, in cross-section, a portion of memory cell 10 taken along line 3—3 of FIG. 2. Those skilled in the art will recognize that memory cell 10 is inversely symmetrical with respect to structures formed in active area 13 and 13', and that, although only structures formed in active region 13 are depicted in the process steps illustrated in FIGS. 3a through 3k, corresponding structures are also formed concurrently in active region 13'.

Shown in FIG. 3a is an active device region 13 of a semiconductor substrate 11 having already undergone several process steps in accordance with the invention. A first gate dielectric layer 15 overlies a peripheral portion of active region 13 and a second gate dielectric layer 17 overlies an intermediate portion of active region 13. A first conductive layer 19 overlies dielectric layers 15 and 17. A doped region 21 is formed in active region 13 underlying a portion of dielectric layers 15 and 17. Doped region 21 will provide a current path for a Vss signal to the memory cell presently under construction. Doped region 21 is preferably formed by oxidizing the surface of substrate 11 to form a sacrificial oxide layer and then forming a photolithographic pattern to define selected portions of active region 13. Preferably Phosphorus, or alternatively, Arsenic, is introduced into substrate 11 by ion implantation using the photolithographic pattern as a dopant mask. In the case of Phosphorus, an ion implantation does of preferably $1.0 \times 10^{13}$ to $1.0 \times 10^{16}$ ions per square centimeter is used. Once implantation is complete, the photolithographic pattern is removed and the sacrificial oxide layer is etched away leaving the surface of substrate 11 exposed.

First gate dielectric layer 15 is preferably formed by thermally oxidizing substrate 11 to form an oxide layer overlying active region 13. A portion of dielectric layer 15 overlying the doped region 21, portion 15', will grow to a thickness of about 10 to 50 nanometers during the oxidation process. However, the remaining portion of dielectric layer 15 which does not overlie doped region 21 will grow to a thickness of about 7.0 to 8.0 nanometers. The phosphorus implanted into active region 13 to form doped region 21 enhances the oxidation rate by a factor of ten relative to the remaining portions of active region 13. Thus, within active region 13, the relatively higher dopant concentration in doped region 13 creates a localized region of increased dielectric thickness during the oxidation process.

Second dielectric layer 17 is then formed by photolithographically patterning then etching first dielectric layer 15 to expose a portion of the surface of substrate 13. After etching, the photolithographic pattern is removed and substrate 11 is oxidized to form a thin dielectric layer having a thickness of about 4.0 to 6.0 nanometers. The difference in gate dielectric thickness between portion 15 and second dielectric layer 17 is important because these layers will eventually become gate dielectric layers for the pass transistors and the NMOS transistors respectively in memory cell 10. The relative gain of the NMOS transistors and pass transistors in memory cell 10 will be determined by the thickness ratio of the first and second dielectric layers 15 and 17. In this manner, a large cell ratio is attained without sacrificing surface area which would otherwise be needed to set the W/L ratios of the pass and NMOS transistors.

After forming first and second dielectric layers 15 and 17, first conductive layer 19 is deposited to overlie the dielectric layers. Preferably, first conductive layer 19 is a polysilicon-refractory metal silicide composition (polycide) and is formed in a three step deposition sequence. In the first step, a portion of layer 19 is deposited to form a first layer of conductive material on substrate 11. A photolithographic pattern is formed and boron is ion implanted into active region 13 using the photolithographic pattern as a doping mask. The boron implant (not shown) will adjust the threshold voltage of the MOS latch transistors which are to be constructed in active region 13. In an alternative method, doped region 21 can be formed at this point in the process rather than after forming a sacrificial oxide layer as previously described. The alternative method, a photolithographic pattern is formed over the first polysilicon layer deposited during the formation of first conductive layer 19. The photolithographic mask defines a portion of active region 13 which is to be doped. Then, a phosphorus or arsenic implantation is performed through the polysilicon layer and dielectric portion 15' to form doped region 21.

After the boron implantation, the photolithographic pattern is removed and a second layer of polysilicon is deposited. The first and second polysilicon layers are then patterned with a dopant mask such as silicon nitride and selectively doped with phosphorus using a thermal doping process. The selective doping process produces a sheet resistance of about 20 to 60 ohms per square in areas exposed by the silicon nitride mask.

After the thermal doping process is complete, the doping mask is removed and a layer of refractory metal silicide is deposited onto the second polysilicon layer. The formation of first conductive layer 19 is completed by a subsequent annealing process to form a silicided polysilicon layer. Preferably, the refractory metal silicide is tungsten silicide sputter deposited to a thickness of about 12.0 nanometers. However, other refractory metal silicides can be used such as silicides of cobalt, titanium, and molybdenum and the like.

Once first conductive layer 19 is formed, a first insulating layer 23 is deposited onto first conductive layer 19, as shown in FIG. 3-a. In one deposition method, silicon dioxide is chemical vapor deposited using tetraethylorthosilane (TEOS), however, another method such as low temperature silicon oxide deposition (LTO) can also be used. Preferably, first insulating layer 23 is deposited to a thickness of 100 to 300 nanometers.

After deposition, first insulating layer 23 is photolithographically patterned and etched to expose a portion of first conductive layer 19 overlying a central portion of active region 13. The pattern is removed and an oxidation process is carried out to form a thin oxide 23' overlying first conductive layer 19, as shown in FIG. 3-b. Thin oxide 23' will protect the NMOS gate electrodes which are to be formed in active region 13 from subsequent etching processes. Following the formation of thin oxide 23', a second insulating layer 25 is formed overlying first insulating layer 23 and thin portion 23'. Preferably, second insulating layer 25 is silicon nitride deposited to a thickness of about 100 nanometers.

After depositing second insulating layer 25, the pass gate and latch gate transistor electrodes are photolithographically defined and, in one method, a sequential anisotropic etch process is used to form the gate electrodes. First, second insulating layer 25 is etched exposing first insulating layer 23, then, layers 23 and 23' are etched exposing first conductive layer 19. Finally, first conductive layer 19 is etched exposing dielectric layers 15, 15' and 17. The sequential etch process forms shared gate 27 (gate extension 27' in the cross-section of FIG. 3-c), shared gate electrode 29, and pass transistor gate 31. After removing the photolithographic pattern, the etched structures appear as illustrated in FIG. 3-c. A portion 33 of conductive layer 19 is formed overlying dielectric layer 15' and doped region 21. Portion 33 is part of a word line 42 which extends across memory bit cell 10, see FIG. 2. Correspondingly, pass transistor gate 31 is a portion of word line 40 overlying active region 13, shown in FIG. 2. In the embodiment illustrated in the plan view of FIG. 2, gate extension 27' does not extend completely across active region 13. This is necessary in order to provide space for contact 46 which is subsequently formed in active region 13.

An alternative etching method employing two separate photolithographic patterning and etching steps can be used to from the electrodes shown in FIG. 3-c. In a first step, pass transistor gate 31 and word line portion 33 are defined and the sequential etch process described above is carried out. In a second step, shared gates 27 and 29 are defined and, again, the sequential etch process is performed. The alternate method has an advantage where the etching processes do not have a large relative etch rate for one material with respect to another. For example, if the etch selectivity for silicon oxide to silicon nitride is not large, the one step, sequential etching process will penetrate thin oxide 23' while layer 25 is being etched.

Once the shared gate electrodes and word lines have been defined, an oxidation step is carried out to form an oxide encapsulation layer 35 overlying the word line portion 33, gate extension 27', and gate electrodes 29 and 31. Next, temporary sidewall spacers 37 are formed on the electrodes and word lines and dielectric layers 15, 15' and 17 are etched, as shown in FIG. 3-d. Preferably, a sidewall spacer forming material such as silicon nitride is deposited and anisotropically etched to form temporary sidewall spacers 37. Spacers 37 act as an etch mask during the etching of dielectric layers 15, 15' and 17. As shown in FIG. 3-d, the etching of dielectric layers 15, 15' and 17, exposes a portion of the surface of active region 13 which is aligned to the gate electrodes 27 and 29.

After etching to expose a portion of the surface of active region 13, the exposed portion is used as a nucleation site for the growth of an epitaxial silicon layer 39 in active region 13, as shown in FIG. 3-e. The epitaxial silicon, having been seeded by the exposed silicon in active region 13, is self-aligned to gate extension 27' and gate electrode 29. The epitaxial layer is used to form self-aligned, elevated source and drain regions for NMOS transistor 20. As illustrated in FIG. 3-e, both elevated source region 43 and elevated drain region 41 are self-aligned to gate electrode 29. The remaining portion of the epitaxial layer 39 provides a substrate contact region for substrate contact 46 at node 26 (shown in FIG. 2). The conductivity of epitaxial layer 39 is adjusted by ion implantation of a n-type dopant such as phosphorus or arsenic into epitaxial layer 39. In an alternative method, epitaxial layer 39 can be doped during epitaxial growth. Preferably, epitaxial layer 39 is oxidized to form a thin oxide layer on the surface and then doped by implantation of arsenic with a dose of about 2.5 to $8.0 \times 10^{15}$ ions per square centimeter. After ion implantation, a third insulating layer 45 is grown on epitaxial layer 39.

Next, the temporary sidewall spacers 37 and remaining portions of second insulating layer 25 are removed exposing a portion of the surface of active region 13 adjacent to word line portion 33, gate extension 27', and gate electrodes 29 and 31. Preferably, a wet etch process is used to remove the spacers leaving spaces between the conductive structures as shown in FIG. 3-f. Lightly doped regions 47 are formed in active region 13 by ion implantation using word line portion 33, gate extension 27', and gate electrodes 29 and 31 as an implant mask. The formation of lightly doped regions 47 in active region 13 electrically couples the channel region below shared gate 29 with elevated source and drain regions 43 and 41. Preferably, phosphorous is implanted with a dose of about $5.0 \times 10^{12}$ to $5.0 \times 10^{15}$ ions per square centimeter.

After forming lightly doped regions 47 in active region 13, the functional elements of NMOS transistor 20 and pass transistor 34 are complete. Referring to FIG. 3-f, NMOS transistor 20 includes shared gate electrode 29 and elevated source and drain regions 43 and 41 electrically coupled to shared gate electrode 29 by lightly doped regions 47. Pass transistor 34 includes gate electrode 31 and elevated source region 49 and an elevated drain region 51 coupled to gate electrode 31 by lightly doped regions 47. In addition, lightly doped regions 47 define channel regions for the transistors 20 and 34 in the portions of active region 13 immediately below the gate electrodes.

Also shown in FIG. 3-f is a Vss contact region 53 adjacent to word line portion 33, but on an opposite side of portion 33 from source region 43. As will subsequently be described, Vss contact region 53 will provide a means for electrically contacting doped region 21 by an overlying conductor. Also, elevated drain region 51 and elevated drain region 41 provide a substrate contact for the formation of shared contact 46 (shown in FIG. 2).

Continuing with the fabrication sequence, permanent sidewall spacers 55 are formed on gate extension 27', gate electrodes 29 and 31, and word line portion 33, as shown in FIG. 3-g. Permanent sidewall spacers 55 are formed by depositing an insulating material, onto substrate 11, filling the spaces between the gates and epitaxial regions, then, anisotropically etching the material to form the spacers. Preferably the insulating material is a material which is differentially etchable with respect to the remaining portions of second insulating layer 25 overlying the gate electrodes and word lines. For example, if first insulating layer 23 is silicon oxide permanent sidewall spacers 55 can be formed by deposition and anisotropic etching of silicon nitride.

Following the formation of permanent sidewall spacers 55, the first transistor level of memory cell 10 is complete. NMOS transistors 16 and 20 and pass transistors 32 and 34 are fully formed having elevated source and drain regions overlying active region 13, and lightly-doped source and drain and channel regions in active region 13. The construction of these transistors having the foregoing features functions to provide a small overall surface area for memory cell 10. The use of elevated source and drain regions formed by selective epitaxial silicon growth offers a small transistor geometry while providing ample space for electrical contact by overlying components. Further advantages are realized by the substantially planar surface remaining after formation of the first transistor level is complete. By eliminating the requirement for overlying conductive structures to make physical contact to the substrate surface, well known problems associated with step coverage are minimized. Considerable variation in surface topography can lead to void formation in conductive leads when the leads traverse areas of extremely uneven surface topography. The particular construction technique of the first transistor level of memory cell 10 seeks to reduce the severity of the step coverage problem.

The fabrication of the conductive structures for the second transistor level begins with the formation of a third dielectric layer 57, as shown in FIG. 3-h. First, portion 23' of second insulating layer 23 overlying gate extension 27' and gate electrode 29 is etched away using a blanket wet etch process. During the blanket etch, part of the exposed portions of insulating layers 23 and 45 are also removed. Then, a third dielectric layer 57 is selectively formed over shared gate electrode 29. Third dielectric layer 57 will form the gate dielectric for PMOS transistor 22. Preferably, third dielectric layer 57 is formed by oxidation of shared gate electrode 29. The oxidation process also forms a thin dielectric over gate extension 27' (not shown). In this manner, the dielectric layer is self-aligned to the underlying gate electrode. Alternatively, third dielectric layer 57 can be formed by chemical vapor deposition of a material such as silicon nitride, oxynitride and the like.

One embodiment of the formation of shared contract 48 is illustrated in FIG. 3-h. Following the formation of third dielectric layer 57, a photolithographic pattern is defined and shared contact 46 is formed by etching away a portion of third insulating layer 45. The etch process also removes the dielectric layer that was formed over gate extension 27' during the formation of third dielectric layer 57. Thus a contact region is opened exposing a portion of drain region 41, drain region 51, and gate extension 27'.

Next, a second conductive layer 59 is deposited to overlie third dielectric layer 57. Second conductive layer 59 is preferably formed by chemical vapor deposition of a SiGe layer. Alternatively, second conductive layer 59 can be polysilicon. Preferably, second conductive layer is deposited to a thickness of about 10 to 100 nanometers and most preferably about 25 nanometers. Second conductive layer 59 will form the conductive channel for PMOS transistor 22.

After the formation of second conductive layer 59, a diffusion barrier layer is formed overlying second conductive layer 59 and the SiGe is annealed to form a crystalline phase. After annealing, the diffusion barrier is photolithographically patterned and etched to form a cap 60 overlying shared gate electrode 29. As illustrated in FIG. 3-i, Cap 60 is aligned to shared gate electrode 29 and overlies a channel portion 61 of second conductive layer 59. Once cap 60 is formed, a boron ion implantation step is performed using cap 60 as an implantation mask. The implantation forms a P-type region aligned to cap 60 to define the source and drain regions of PMOS transistor 22. Next, a refractory metal is deposited to overlie second conductive layer and the structure is annealed to form a refractory metal silicide. Preferably, the refractory metal is titanium deposited to a thickness of about 20 to 80 nanometers. However, other refractory metals can be used that will form a silicide material differentially etchable with respect to third insulating layer 45 and first insulating layer 23. Alternatively, refractory metals such cobalt, tungsten, tantalum, and the like can also be used. During the annealing process, cap 60 prevents the formation of a refractory metal silicide in channel portion 61 and thereby functions to self-align the silicided portions of second conductive layer 57 to channel portion 61.

After silicide regions are formed, second conductive layer 59 is photolithographically patterned and etched to form thin-film source and drain regions 65 and 63, as shown in FIG. 3-j. With the formation of thin-film source and drain regions 65 and 63, PMOS transistor 22 is complete. PMOS transistor 22 includes a conductive channel, channel portion 61, overlying and aligned to shared gate electrode 29, and thin-film source and drain region 65 and 63 which are also aligned to shared gate electrode 29. As further illustrated in FIG. 3-j, thin-film drain region 63 of PMOS transistor 22 makes contact to both elevated drain region 41 of NMOS transistor 20, and to elevated drain region 51 of pass transistor 34 at shared contact 46.

The process of selective silicide formation provides PMOS transistor 22 with source and drain regions having different conductivity characteristics than the channel region. The formation of PMOS transistor 22, using the foregoing inventive combination of materials and processes, provides a PMOS transistor having desired electrical characteristics while maintaining a minimal vertical thickness. For example, the conductive regions of PMOS transistor 22 provide sufficient resistance to pull the voltage level up following a read-write operation and to avoid current leakage from the cell. This function is accomplished through the particular combination of current resistivities of the silicide source and drain regions and the SiGe channel region. The use of both a refractory metal silicide and SiGe permits the conductive region of PMOS transistor 22 to be constructed from thin-films having a layer thickness far less than PMOS pull up transistors using a conventional combination of materials.

Following the formation of PMOS transistor 22, a fourth insulation layer 67 is deposited to overlie pass transistor 34, word line portion 33 and PMOS transistor 22. Fourth insulating layer 67 is preferably chemical vapor deposited to a thickness of about 150 to 250 nanometers, and most preferably, about 60 to 200 nanometers. In one method, TEOS is used to form a layer of silicon dioxide. Alternatively, fourth insulating layer 67 can be silicon nitride or a spin-on dielectric material such as silicon glass and the like. After deposition, fourth insulating layer 67 is photolithographically patterned and etched to form bit line and Vss contact openings over source region 49 and Vss contact region 53 respectively, as illustrated in FIG. 3-k. Next, a third conductive layer 69 is deposited onto fourth insulating layer 67 and etched to form a Vss land 71 and a bit line land 73. Third conductive layer 69 is preferably polysilicon conformably deposited by chemical vapor deposition to a thickness of preferably about 200 to 300 nanometers and most preferably about 250 nanometers. The polysilicon is then preferably doped by ion implantation with Arsenic, or alternatively with Phosphorus. Alternatively, third conductive layer 69 can be doped either during deposition or immediately following deposition by a dopant gas introduced to the deposition apparatus.

In another process embodiment, Vss contact land 71 and bit line land 73 can be formed by selective silicon deposition process. In the selective deposition, Vss contact region 53 and source region 49 act as seed layers for the nucleation of silicon atoms and the subsequent formation of a layer of silicon.

As illustrated in FIG. 3-k, Vss contact land 71 extends upward from Vss contact region 53 and onto fourth insulating layer 67 to overlie word line portion 33 and PMOS transistor 22. Similarly, bit line land 73 extends upward from source region 49 and overlies a portion of pass transistor 34. Referring to FIG. 2, Vss land 71 makes contact with Vss contact region 53 at Vss contact 52. Also, bit line land 73 makes contact with source region 49 at bit line contact 48.

A particular advantageous feature of the invention is evident by the use of a portion of the surface area over active region 13, and of course, active region 13', for providing Vss and bit line land structures. Vss and bit line lands 71 and 73 are constructed in such a way as to provide a large surface upon which electrical contact can be made by overlying conductive leads (not shown). The surface area provided by lands 71 and 73 is proportionally large in comparison to the total surface area of memory cell 10. The formation of PMOS transistors 18 and 22 using selected materials having a small vertical thickness enables lands 71 and 73 to be formed over memory cell 10 without the unwanted result of steep topographic contrast across the cell.

Another important feature of the invention is the use of the substrate area underlying word lines 40 and 42 as a conductive path for providing a Vss signal to the drains of NMOS transistors 16 and 20. Doped region 21 is formed in an area of the substrate where the word lines cross over the active regions 13 and 13'. Dielectric portion 15' effectively isolates doped region 21 from electrical influence of overlying word line portion 33. It will be recalled that dielectric portion 15' has a thickness substantially greater than gate dielectric layer 15 because the high doping level created a localized oxidation rate increase in doped region 21. The construction of a Vss signal path below the word lines permits a Vss contact to be formed at a portion of the active areas on the side of the word lines opposite to the active transistors. Thus a memory cell having a small surface area is achieved by providing an overlying structure for introduction of a Vss signal to the cell, together with coupling the Vss signal to the NMOS transistors through a portion of the substrate underlying the word lines.

Figure 4:
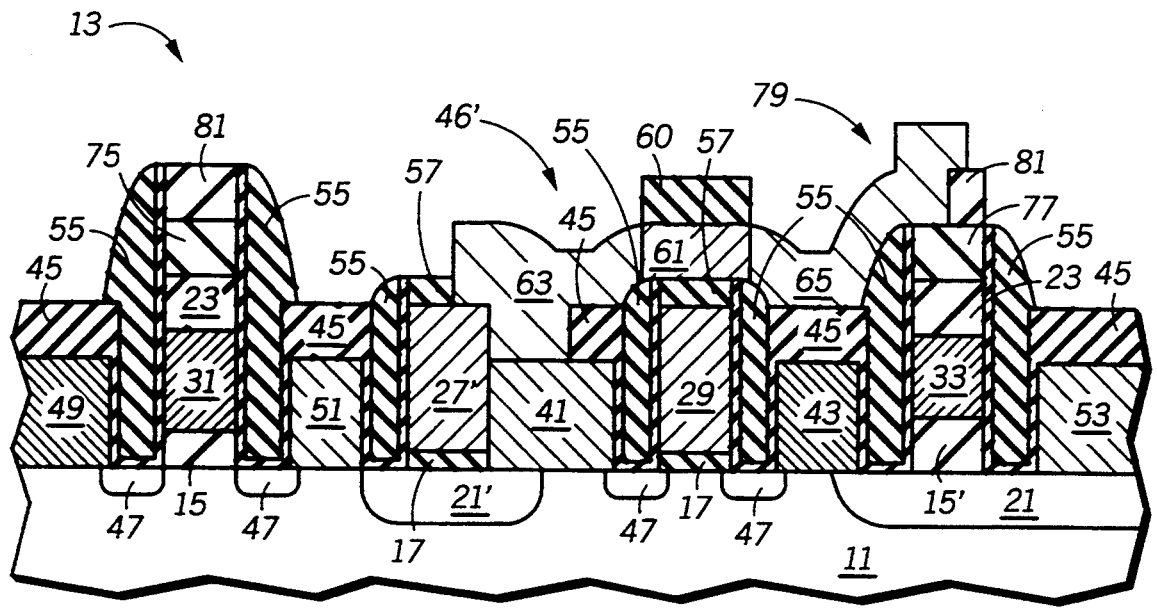
FIG. 4, illustrates, in cross section, a further embodiment of the invention.

A further embodiment of the invention is illustrated, in cross section, in FIG. 4. A memory cell 10' features a shared contact 46' formed by removing a portion of sidewall spacer 37 and oxide layer 35 overlying one side of gate extension 27'. In addition, memory cell 10' has signal Vdd lines 75 and 77 overlying word lines 40 and 42 respectively. A Vdd contact 79 is made electrically connecting source region 65 to Vdd signal line 77. Further illustrated in memory cell 10' is a doped region 21' formed in active region 13 and underlying shared gate electrode 27. It will be apparent to those skilled in the art that the further embodiments of the invention illustrated in memory cell 10' can be incorporated individually or together in the memory cell of the present invention.

To form shared contact 46', portions of sidewall spacer 37 and oxide layer 35 overlying gate extension 27' are etched away prior to epitaxial growth of elevated drain region 41. During epitaxial growth, elevated drain region 41 makes direct contract with the exposed sidewall of gate extension 27'. Later, when the conductive channel region of PMOS transistor 22 is formed, thinfilm drain region 63 makes contact with the junction of elevated drain region 41 and gate extension 27'.

Figure 5:
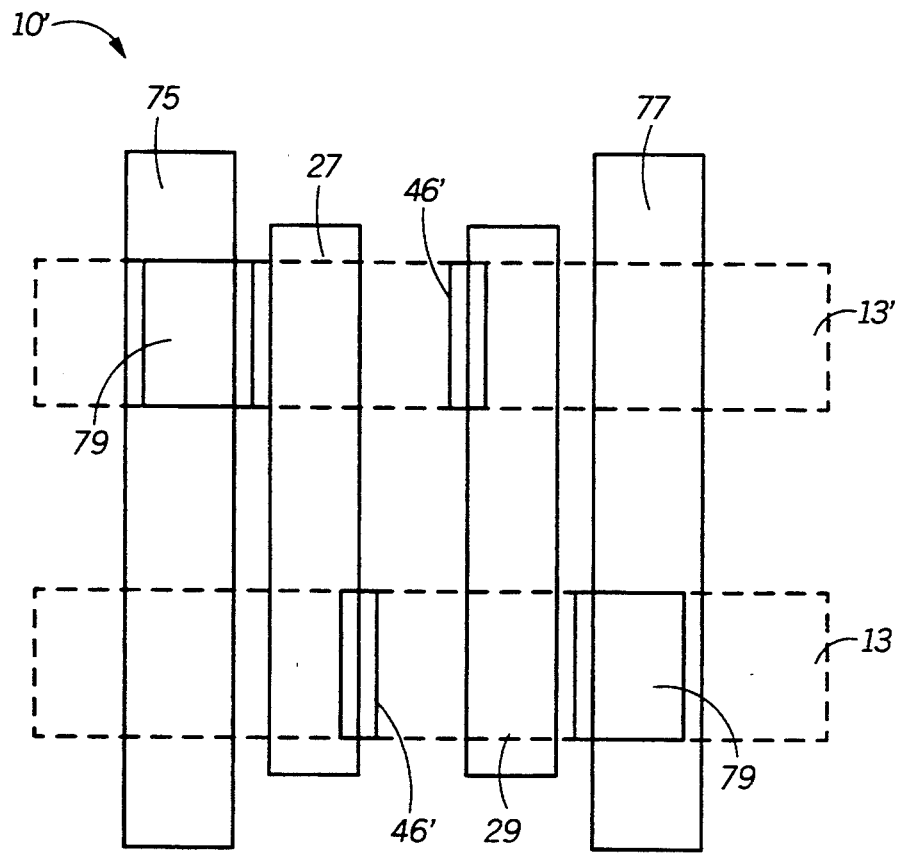
FIG. 5 is a plan view of a memory cell constructed in accordance with the further embodiment of the invention.

The construction of a shared contact 46' on the sidewall of gate extension 27' provides a large surface area for metallurgical contact between gate extension 27' and drain regions 41 and 63. The contact can utilize the vertical distance available along the sidewall of gate extension 27' for metallurgical contact instead of the lateral surface area elevated drain region 41. The formation of shared contact 46' as a sidewall contact permits the shared gate electrodes to extend beyond active regions 13 and 13'. The cell layout using shared contact 46' is shown in the plan view of FIG. 5. The more symmetrical layout of cell 10' is advantageous from a manufacturing stand point because uniform dimensions are presented.

Shared contact 46' is formed by removing a portion of temporary sidewall spacer 37 shown in FIG. 3-d. A photolithographic pattern is formed and the portion of spacer 37 overlying the edge of gate extension 27' opposite pass transistor gate 31 and the underlying portion of oxide encapsulation layer 35 are etched away. Subsequently, during the epitaxial growth of elevated drain region 41 a metallurgical junction is formed at the edge of gate extension 27'. The deposition and etching process used to form thin-film drain region 63 then proceeds as described previously.

Also illustrated in memory cell 10' are Vdd lines 75 and 77. Construction of Vdd signal lines overlying word lines 40 and 42 illustrates one embodiment of the invention for introducing the Vdd signal shown in FIG. 1 to memory cell 10'. Source region 65 of PMOS transistor 22 extends onto the upper surface of Vdd line 77 forming Vdd contact 79. The alternate contact is formed to Vdd signal line 75 where it passes over active region 13'(not shown). The alternating Vdd and shared contacts are shown in plan view in FIG. 5. Where a Vdd contact is not to be formed, a Vdd insulation layer 81 is provided.

Vdd signal lines 75 and 77 are formed in a manner similar to word lines 40 and 42. Once the layers shown in FIG. 3-b are in place, a third conductive layer and a Vdd insulation layer are deposited. The stacked structures comprising insulation layer 81, Vdd lines 75 and 77, first insulating layer 23, and word lines 40 and 42 are patterned and etched sequentially in a manner analogous to the procedure described relating to FIG. 3-c. Prior to formation of second conductive layer 59, Vdd insulation layer 81 is patterned and etched to form openings for Vdd contact 79.

Doped region 21' functions to balance the resistive load in memory cell 10'. Doped region 21' is preferably formed in active region at the point in the process as doped region 21. Referring to FIG. 3-a, substrate 11 is photolithographically patterned and an ion implantation process is performed. In one method, doped region 21' is formed simultaneously with doped region 21 using the same implantation dose for both regions. Alternatively, a separate masking step can be used and doped region 21' can be formed with a different implantation dose than doped region 21. Preferably, doped region 21' is formed with an implant dose having a value equal to or less than the implantation dose used to form region 21. In a preferred embodiment, doped region 21' is formed by the ion implantation of Phosphorus using a dose $1.0 \times 10^{12}$ to $1.0 \times 10^{15}$ ion per square centimeter.

Thus it is apparent that there has been provided, in accordance with the invention, a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

For example, a local interconnect can be made to source regions of PMOS transistors 18 and 20 to provide a Vdd signal to the memory cell 10. To form the local interconnect for PMOS transistor 20, referring to FIG. 3-k, an opening is etched through fourth insulating layer 67 exposing a portion of thin-film source region 65. A layer of refractory metal, such as titanium, tungsten or the like is deposited and annealed in a nitrogen ambient to form a silicided region and a refractory metal nitride overlying remaining portions of fourth insulating layer 67. An insulating layer is formed over the interconnect and the process continues as previously described with the deposition of third conductive layer 69. When land 71 is defined, a contact opening is formed for contact to the interconnect by an overlying Vdd signal line.

Additionally, a separate gate electrode can be formed for the PMOS transistor. The electrode can be formed for example by depositing a separate conductive layer followed by photomasking and etching to form an isolated gate electrode overlying the active regions. It is desirable, in the case of a PMOS transistor, to dope the electrode to have a P-type conductivity. It is therefore intended to include within the invention all such variations and modifications as fall within the scope of the appended claims and equivalents thereof.

We claim:

1. A memory cell comprising:
   a semiconductor body having an active region;
   a CMOS device having a first transistor of one conductivity type overlying a central portion of the active region and a second transistor of opposite conductivity type overlies the first transistor.
   wherein the first transistor comprises elevated source and drain regions overlying the active region and spaced apart by a shared-gate electrode, and
   a first dielectric layer having a first selected thickness separating the shared-gate electrode from the active region, and
   first and second lightly doped regions in the active region underlying the shared-gate electrode and spaced apart by a first channel region;
   a word line overlying an end portion of the active region;
   a Vss signal line formed in the active region passing under a portion of the word line and electrically coupled to the first transistor, wherein the Vss signal line comprises a doped region in the active area underlying the word line portion and separated from the word line portion by a second dielectric layer having a second selected thickness;
   a conductive body electrically isolated from the word line portion and the CMOS device which contacts the active region adjacent to the word line portion and extends upward therefrom to overlie the word line portion and at least a portion of the CMOS device.

2. The memory cell of claim 1 wherein the second transistor of the CMOS device comprises:
   second source and drain regions overlying and electrically isolated from the elevated source and drain regions;
   a third dielectric layer having a third selected thickness overlying the shared-gate electrode; and
   a second channel region overlying the third dielectric layer.

3. The memory cell of claim 2 wherein the source and drain region of the second transistor and the second channel region are formed in a conductive layer overlying the shared-gate electrode and the elevated source and drain regions of the first transistor and wherein the second channel region is comprised of a SiGe alloy material aligned to the shared-gate electrode.

4. A memory cell for a semiconductor device comprising:
   a semiconductor substrate having first and second active device regions;
   a first CMOS inverter overlying the first active region;
   a second CMOS inverter overlying the second active region;
   first and second word lines spaced apart by the first and second CMOS inverters and overlying a portion of the first and second active regions;
   a first Vss region in a portion of the first active region passing under a first portion of the first word line and electrically coupled to the first CMOS inverter; and
   a second Vss region in a portion of the second active device region passing under a first portion of the second word line and electrically coupled to the second CMOS inverter.

5. The memory cell of claim 4 further comprising:
   a first pass gate transistor in the first active region opposite the first Vss region wherein the gate electrode of the first pass gate transistor is formed by a second portion of the first word line; and
   a second pass gate transistor in the second active region opposite the second Vss region wherein the gate electrode of the second pass gate transistor is formed by a second portion of the second word line.

6. The memory cell of claim 5 further comprising:

an insulating layer overlying the first and second active regions; and first and second bit line contact openings in the insulating layer adjacent to the first and second pass gate transistors respectively, each contact having a polysilicon body overlying the active region and extending upward through the contact opening and overlying a peripheral region around the contact opening.

7. A memory cell for a semiconductor device comprising:

a semiconductor substrate having a principal surface;

first and second active regions in the substrate, each active region having first and second elongated opposed parallel sides and first and second narrow opposed parallel sides;

first and second CMOS inverters overlying a central portion of the first and second active regions respectively, each CMOS inverter having a shared-gate electrode disposed in a direction parallel to the narrow sides of the first and second active regions, and each CMOS inverter having elevated source and drain regions overlying the principal surface in the first and second active regions and spaced apart by the shared gate electrode, and each CMOS inverter having thin-film source and drain regions overlying the shared gate electrode and the elevated source and drain regions and spaced apart therefrom by an insulating layer;

first and second word lines overlying the first and second active regions disposed in a direction parallel to the shared-gate electrodes and separated by the first and second CMOS inverters;

first and second Vss connection means electrically coupling a Vss signal from a Vss signal line external to the memory cell to the elevated source regions of the first and second CMOS inverters respectively; and first and second Vdd connection means electrically coupling a Vdd signal to the first and second CMOS inverters.

8. The memory cell of claim 7 wherein the first Vss connection means comprises:

a doped region in the first active region underlying the first word line making electrical contact with the elevated source region of the first CMOS inverter;

a first conductive layer electrically isolated from the first word line overlying the principal surface between the first word line and first narrow side of the first active region, the conductive layer making electrical contact with a portion of the doped region; and a second conductive layer overlying a portion of the first conductive layer and overlying at least a portion of the first CMOS inverter.

9. The memory cell of claim 7 wherein the second Vss connection means comprises:

a doped region in the second active region underlying the second word line making electrical contact with the elevated source region of the second CMOS inverter;

a first conductive layer electrically isolated from the second word line overlying the principal surface between the second word line and second narrow side of the second active region, the conductive layer making electrical contact with a portion of the doped region; and a second conductive layer overlying a portion of the first conductive layer and overlying at least a portion of the second CMOS inverter.

10. The memory cell of claim 7 wherein the first Vss connection means comprises:

a doped region in the first active region underlying the first word line making electrical contact with the elevated source region of the first CMOS inverter;

a conductive body electrically isolated from the first word line overlying the principal surface between the first word line and first narrow side of the second active region, the conductive body making electrical contact with a portion of the doped region and extending upward to overlie a portion of the first CMOS inverter.

11. The memory cell of claim 7 wherein the second Vss connection means comprises:

a doped region in the second active region underlying the second word line making electrical contact with the elevated source region of the second CMOS inverter;

a conductive body electrically isolated from the second word line overlying the principal surface between the second word line and second narrow side of the second active region, the conductive body making electrical contact with a portion of the doped region and extending upward to overlie a portion of the second CMOS inverter.

12. The memory cell of claim 7 wherein the first Vdd connection means comprises:

a Vdd signal line overlying and electrically isolated from the first word line; and a portion of the thin-film source region of the first CMOS inverter overlying and in electrical contact with a portion of the Vdd signal overlying the first active region.

13. The memory cell of claim 7 wherein the second Vdd connection means comprises:

a Vdd signal line overlying and electrically isolated from the second word line; and a portion of the thin-film source region of the second CMOS inverter overlying and in electrical contact with a portion of the Vdd signal overlying the second active region.

14. A memory cell for a semiconductor device comprising:

a substrate having a principal surface;

an active region formed in the substrate;

first elevated source and drain regions of a first conductivity type in the active region overlying the principal surface and spaced apart by a shared gate electrode;

thin-film source and drain regions of a second conductivity type overlying the shared gate electrode and the elevated source and drain regions and separated therefrom by an insulating layer;

a gate extension overlying at least a portion of the active region and spaced apart from the shared gate electrode by the elevated drain region;

a pass gate electrode overlying the active region and spaced apart from the gate extension by a second elevated drain region of the first conductivity type;

an electrically isolated word line overlying the active region and spaced apart from the shared gate electrode by the first elevated source region;

a Vss contact region overlying the active region and spaced apart from the first elevated source region by the isolated word line;

a doped region in the active region underlying the isolated word line electrically coupling the Vss contact region to the first elevated source region; and a shared contact wherein a metallurgical junction is formed between the first and second elevated drain regions, the gate extension, and the thin-film drain region.

15. The memory cell of claim 14 further comprising:

a Vdd signal line overlying an electrically isolated from the word line; and a Vdd contact wherein the thin-film source region overlies at least a portion of the Vdd signal line forming a metallurgical junction therebetween.

16. The memory cell of claim 14 wherein the shared contact comprises:

a sidewall spacer electrically isolating the gate extension from the first and second elevated drain regions;

a first portion of the thin-film drain overlying and in electrical contact with the first elevated drain region;

a second portion of the thin-film drain overlying and in electrical contact with the gate extension; and a third portion of the thin-film drain overlying and in electrical contact with the second elevated drain region.

17. The memory cell of claim 14 wherein the shared contact comprises:

a portion of the second elevated drain region contacting a sidewall portion of the gate extension; and a portion of the thin-film drain overlying and in electrical contact with the second elevated drain region and a sidewall portion of the gate extension.

* * * * *